United States Patent
Leroy et al.

(10) Patent No.: US 6,264,813 B1
(45) Date of Patent: Jul. 24, 2001

(54) CATHODIC SPUTTERING TARGETS MADE OF ALUMINUM ALLOY

(75) Inventors: Michel Leroy, Saint Egreve; Jean Muller, Tarascon-sur-Ariège; Bruno Chenal, Saint-Etienne-de-Crossey, all of (FR)

(73) Assignee: Aluminum Pechiney, Paris (FR)

( * ) Notice: Subject to any disclaimer, the term of this patent is extended or adjusted under 35 U.S.C. 154(b) by 0 days.

(21) Appl. No.: 09/417,888

(22) Filed: Oct. 14, 1999

Related U.S. Application Data

(63) Continuation of application No. 09/101,671, filed as application No. PCT/FR97/02142 on Nov. 27, 1997, now abandoned.

(30) Foreign Application Priority Data

Dec. 4, 1996 (FR) .................................... 96/15116

(51) Int. Cl.$^7$ .................................................. C23C 14/34
(52) U.S. Cl. ........................................................ 204/298.13
(58) Field of Search ........................... 204/298.12, 298.13

(56) References Cited

U.S. PATENT DOCUMENTS

| | | | |
|---|---|---|---|
| 3,763,686 | 10/1973 | Besel et al. | 148/689 |
| 3,945,860 | 3/1976 | Winter et al. | 148/689 |
| 4,164,434 | 8/1979 | Fister, Jr. et al. | 148/437 |
| 4,182,640 | 1/1980 | Yokota | 148/438 |
| 4,213,800 | 7/1980 | Mayo et al. | 420/537 |
| 4,510,207 | 4/1985 | Mehada et al. | 148/438 |
| 4,609,408 | 9/1986 | Rodrigues et al. | 158/437 |
| 4,673,623 | 6/1987 | Gardner et al. | 428/620 |
| 4,828,794 | 5/1989 | Scott et al. | 420/537 |
| 4,966,676 * | 10/1990 | Fukasawa et al. | 204/298.12 |
| 5,032,468 | 7/1991 | Dumont et al. | 428/636 |
| 5,171,642 | 12/1992 | DeHaven et al. | 428/620 |
| 5,196,916 | 3/1993 | Ishigami et al. | 257/769 |
| 5,202,274 | 4/1993 | Bae et al. | 437/40 |
| 5,268,236 | 12/1993 | Dumont et al. | 428/636 |
| 5,458,697 | 10/1995 | Ishigami et al. | 148/212 |
| 5,590,389 * | 12/1996 | Dunlop et al. | 419/61 |
| 5,679,983 | 10/1997 | Ishigami et al. | 257/65 |

FOREIGN PATENT DOCUMENTS

| | | | | |
|---|---|---|---|---|
| 0 442 752 A1 | 2/1991 | (EP) | | C22B/34/10 |
| 0 573 002 A1 | 6/1993 | (EP) | | C23C/14/34 |
| 0 681 328 A2 | 4/1995 | (EP) | | H01L/23/532 |
| 2 744 805-A1 | 2/1996 | (FR) | | 29/4 |
| 58 221265 | 12/1983 | (JP) | . | |
| 62 235451 | 10/1987 | (JP) | . | |
| 62 235452 | 10/1987 | (JP) | . | |
| 62 235453 | 10/1987 | (JP) | . | |
| 62 235454 | 10/1987 | (JP) | . | |
| 62 240733 | 10/1987 | (JP) | . | |
| 62 240734 | 10/1987 | (JP) | . | |
| 62 240735 | 10/1987 | (JP) | . | |
| 62 240736 | 10/1987 | (JP) | . | |
| 62 240737 | 10/1987 | (JP) | . | |
| 62 240738 | 10/1987 | (JP) | . | |
| 62 240739 | 10/1987 | (JP) | . | |
| 04 009466A | 1/1992 | (JP) | | 204/298.13 |
| 07 300667A | 11/1995 | (JP) | | 204/298.13 |
| 08 144030 | 10/1996 | (JP) | . | |

OTHER PUBLICATIONS

David B. Knorr, *The Role of Texture on the Reliability of Aluminum–Based Interconnects*, Mat. Res. Soc. Symp. Proc. vol. 309, 1992 Materials Research Society, pp. 75–86.

Krishna Rajan, Microstructural Stability Issues in the Reliability of Thin Film Interconnects, Electrochemical Society Proceedings, vol. 95–3, pp. 81–93.

John E. Hatch, Aluminum—Properties and Physical Metallurgy, American Society for Metals, American Society for Metals, Metals, Park, Ohio, pp. 120–121.

P. 1000 of *Aluminum Taschenbuch*, 14th Edition, Aluminum–Verlag Dusseldorf.

Paul R. Besser, Strain Relaxation and In–Situ Observation of Voiding In Passivated Aluminum Alloy Lines, Mat. Res. Soc. Symp. Proc. vol. 309, 1993 Materials Research Society, pp. 181–186.

Paul R. Besser, X–Ray Determination and Finite–Element Modeling of Stress In Passivated Al–0.5% Cu Lines During Thermal Curing, Mat. Res. Soc. Symp. Proc. vol. 309, 1993 Materials Research Society, pp. 287–292.

* cited by examiner

*Primary Examiner*—Nam Nguyen
*Assistant Examiner*—Gregg Cantelmo
(74) *Attorney, Agent, or Firm*—Connolly Bove Lodge & Hutz LLP

(57) ABSTRACT

The invention concerns a cathode pulverization target characterized in that its active part, i.e. the volume of the target capable of being removed during the cathode pulverization, consists of a high purity aluminum alloy simultaneously containing copper and iron and having simultaneously a recrystallization temperature well above 20° C. and an electric resistivity less than 2.85 $\mu\Omega$.cm at 20° C. The use of the target for making bonding circuits reduces the frequency at which voids and hillocks appear, while maintaining the resistance of the bonding circuits at values comparable to the resistance obtained with a high purity aluminum alloy, while also providing the etching characteristics comparable to those of high purity aluminum alloy.

9 Claims, 1 Drawing Sheet

CATHODIC SPUTTERING TARGETS MADE OF ALUMINUM ALLOY

RELATED APPLICATIONS

This is a continuation of application Ser. No. 09/101,671 filed Jul. 15, 1998 now abandoned, which was the national stage of International Application No. PCT/FR97/02142, filed Nov. 27, 1997, and the entire contents of which are incorporated herein by reference.

TECHNICAL FIELD

This invention relates to cathodic sputtering targets designed for metallization of various substrates. It particularly relates to targets designed for the manufacture of integrated circuits, particularly for the manufacture of interconnection circuits, and for metallization of large flat panel displays (FPD).

The invention relates particularly to aluminum alloys used for the active part of cathodic sputtering targets.

In this application, the contents of elements and impurities are expressed in values by weight.

STATE OF PRIOR ART AND PROBLEMS

The electronics industry uses large quantities of electrical interconnection circuits based on aluminum or aluminum alloys, particularly in very high level integration circuits such as DRAM dynamic memories with a capacity exceeding 4 Megabits, and flat panel displays (FPD) such as liquid crystal displays (LCD) and particularly displays controlled by thin film transistors (TFT).

These interconnection circuits are obtained industrially using the well known technique of cathodic sputtering, which is capable of depositing different types of refractory or non-refractory, alloyed or unalloyed, conducting or dielectric materials, on different types of substrates that may be put under a vacuum and that can resist a small temperature rise. Known procedures generally include a series of substrate metallization, etching and passivation operations on the metallic layer. During metallization, the substrate is generally kept at a temperature, called the metallization temperature (Tm) exceeding 180° C., and usually of the order of 200° C. to 250° C., although the current trend is to use metallization temperatures of the order of 170° C. to 200° C.

In very high level integration circuits, the metallic layer is typically 0.5 $\mu$m to 1 $\mu$m thick, the etching is very thin (typically of the order of 0.25 to 0.5 $\mu$m) and current densities are very high, sometimes as high as $10^6$ A/cm$^2$, particularly during accelerated aging tests. Under these conditions, a degradation of circuits is observed during use due to an electromigration phenomenon that causes the formation of holes and protrusions. A well known way of solving this problem is to do the metallization using aluminum alloys with high contents (usually greater than 2500 ppm) of chosen added alloying elements (additives) such as Cu, Ti, Si., Sc, Pd and combinations of these elements. However, these alloys have the disadvantage that etching is fairly difficult, particularly due to the different reactivity of aluminum and additives to reagents used for etching the circuits, and the sometimes difficult removal of products derived from chemical etching reactions, particularly for dry etching processes.

Japanese patent applications JP 62.235451 to JP 62.235454 and JP 62.240733 to JP 62.240739 also describe the use of high purity aluminum alloys containing limited additions (usually less than 200 ppm) of copper, cobalt, manganese, nickel, tin, indium, gold or silver together with additions of refractory metals such as titanium, zirconium, hafnium, vanadium, niobium, tantalum, chromium, molybdenum or tungsten in quantities between 20 and 7000 ppm and additions of boron, carbon, and/or nitrogen in quantities of between 20 and 5000 ppm. These complex alloys have the disadvantage that they are difficult to make, and particularly that they flow without local segregations of inter-metallic elements, which can cause heterogeneity of the target composition.

However in the case of flat panel displays, the width of etchings is usually greater than or equal to 10 $\mu$m, and the use of widths of the order of 5 $\mu$m is considered in order to improve the image definition. Therefore, etchings of flat panel displays are much less fine than etchings of very high level integration circuits. Current densities are also significantly lower. Under these conditions, deterioration of circuits by electromigration is practically non-existent, such that the use of alloys with high contents of additives is no longer justified. Therefore, it is usually preferred to use very pure unalloyed aluminum which has the important advantage that it is much more easily etched than alloys, and that it has a very high electrical conductivity and good resistance to corrosion.

The current trend in the field of flat panel displays, which is developing very quickly, is the production of large displays. Current developments are aimed particularly at PC monitors with diagonals measuring 17" and 20", and flat wall television screens with 40" diagonal, in other words surface areas of up to about 0.5 m$^2$. Furthermore, for productivity and efficiency reasons, these monitors and screens are obtained either directly or by cutting from the same substrates (also called "glasses"). Consequently, the current trend is a fast increase in the size of glass substrates. The current standard formats are about 360 mm×460 mm, and will soon be increased to 550 mm×650 mm, and the use of substrates of about 800 mm×1000 mm is being considered for simultaneous production of 17", 20" and 40" diagonal flat panels.

These trends have rendered preponderant the problem of the appearance of "voids" and "hillocks" at the surface of metallization films during heat treatments inherent to monitor manufacturing processes, making the films unusable more and more frequently as the display size increases. In particular, this is the case for displays manufacturing processes that include the formation of thermal oxide films by heating to temperatures exceeding 300° C. or the deposition of complementary layers by chemical vapor deposition (CVD). The voids and hillocks produced by this type of heat treatment can cause interconnection faults that degrade the image quality. Since the image quality criteria are severe, only a few faults are necessary to make it necessary to scrap a complete monitor during production.

The cause of this problem is not well understood. According to one explanation put forward (P. R. Besser et al, Materials Research Society, Symposium Proceedings, Vol. 309, 1993, p. 181–186 and 287–292), and which is generally accepted, the appearance of hillocks and voids is particularly due to the appearance of very severe constraints caused by the large difference in the coefficient of thermal expansion between the aluminum film and the substrate. These stresses could significantly exceed the yield strength of aluminum. When the monitor temperature is increased above the metallization temperature, the aluminum film would be put into compression and some grains (the more plastic) would be extruded outside the film under the pressure of the adjacent grains. During cooling, the film would be tensioned and holes would appear thus relaxing the stresses (phenomenon referred to as stress voiding). According to some authors, the appearance of hillocks is related to the existence of areas with grains with a different orientation than the rest of the film when the film has a strong structure (D. B. Knorr, Materials Research Society, Symposium Proceedings, Vol. 309, 1993, p. 75–86). Finally, other authors associate the formation of hillocks with a phenomenon of abnormal growth of some grains due to the existence of some joints with a particular orientation and with a very high mobility (K. Rajan, Electrochemical Society Proceedings, Vol. 95–3, 1995, p 81–93).

It is proposed to solve this problem, particularly in the field of integrated semiconductor circuits, by using multi-layer interconnection circuits, in other words formed of alternate thin layers of aluminum alloys and refractory metals. For example, the American patent U.S. Pat. No. 4,673,623 recommends the use of several alternate layers of aluminum alloy (Al+1% Si) and titanium or tungsten. According to European patent application No. 681 328 by Xerox Corp., the thickness of each alternate layer is preferably limited to a small value less than a critical value at which the hillocks occur. U.S. Pat. No. 5,171,642 to IBM Corp. proposes the use of alternate layers of an aluminum alloy preferably containing 0.5% Cu, and a refractory metal (preferably titanium) that reacted with aluminum to form inter-metallic compounds such as $TiAl_3$. U.S. Pat. No. 5,202,274 also proposes forming an aluminum oxide layer on the aluminum alloy conductor such as Al—Si, Al Pd, Al—Ni, Al—Ge or Al—W. However multi-layer interconnection circuits which are obtained using these solutions and which offer satisfactory resistance to the formation of hillocks have a high electrical resistance and, even in the best cases, more than 3.3 $\mu\Omega$.cm. These solutions also have the disadvantage that they complicate the manufacturing processes, which significantly increases manufacturing costs, sometimes to the point that they are not economically viable.

A proposal has also been made to use the same alloys that are used in very high level integration circuits to eliminate the problem of degradation by electromigration, such as Al+0.5% Cu, Al+0.1% Cu+0.15% Ti, Al+0.5% Cu+1% Si. Another proposal is to use special alloys with high contents of additive elements capable of limiting the appearance of the hillocks such as alloys with 12% Ta, or alloys containing high combined contents of Ti and B, and therefore rich in $TiB_2$ inter-metallic precipitates (about 500 ppm), or alloys containing 10% by weight of Nd.

However, these alloys with high added contents of refractory elements or additive elements, are very difficult to make and/or cast when making targets under conditions that guarantee cleanliness, in other words a low content of gas and/or non-metallic inclusions, such as carbides, nitrides and oxides, and the macroscopic and microscopic homogeneity of the composition, which is essential to prevent etching faults occurring later that make the film unusable, such as the deposit of particles that cannot be etched during the alloy film etching step, or the formation of a chemically heterogeneous film.

In particular, alloys containing rare earths such as neodyne, which is very reactive, are very difficult to make and to cast by direct casting while simultaneously guaranteeing the lack of harmful refractory inclusions such as oxides, carbides, etc. When the target is being used, these inclusions may provoke the formation of local micro-arcs and consequently the deposit of particles or droplets on and in the metallization film which will subsequently result in severe etching faults.

Secondly, alloys with additives also make etching very difficult due to the presence of intermetallic precipitates, the presence of which is essential when moderate resistivity is required. This difficulty appears particularly with alloys containing copper. Etching reagents suitable for etching of aluminum react with the copper present in the alloy when the etching process is taking place and produce chemical compounds such as chlorides or fluorides which are not easily volatile or are not easily soluble in frequently used cleaning solvents. Furthermore, copper forms $Al_2Cu$ precipitates that make etching more difficult when they are large compared with etching dimensions.

The film homogeneity criterion also becomes particularly important when the substrate is large, since the dimensions of the target generally increase with the dimensions of the substrate. The film homogeneity depends on the grain fineness, the homogeneity and the uniformity of the composition in the entire active volume of the target, which is more difficult to achieve in large targets when alloys contain additives. Alloys with refractory additives, such as alloys containing Ta and $TiB_2$, have a very high complete melting temperature, which causes severe problems when casting large blanks using the conventional continuous casting process, which is the only way of ensuring a very uniform distribution of alloy elements without local segregation in the cast part.

Furthermore, the electrical resistivity of alloys with additives is significantly higher than for pure aluminum, even after heat treatment subsequent to metallization. The resistivity of the alloys used or considered is usually greater than 3 $\mu\Omega$.cm, even after heat treatment. Consequently, the energy consumption during use of displays is greater, which in particular reduces the endurance of portable battery powered systems. An increase in the resistivity also increases the response time to electrical pulses controlling elementary pixel control transistors, which is particularly annoying for applications such as video flat displays for which a high image refreshment rate is necessary.

Finally these alloys frequently increase the manufacturing costs, making them unviable.

Therefore, the applicant searched for aluminum alloys that would significantly reduce the appearance of hillocks and voids during heat treatment, which have an electrical resistivity and etching conditions similar to pure aluminum, and which are easy to make under conditions in which the limiting contents of dissolved gases and inclusions can be guaranteed, together with high homogeneity of the composition.

DESCRIPTION OF THE INVENTION

The first object of the invention is a cathodic sputtering target designed for making interconnection circuits for electronic circuits, characterized in that its active part, in other words the target volume that may be removed during cathodic sputtering operations, is composed of a high purity aluminum alloy containing both copper and iron, in which the recrystallization temperature is significantly higher than the ambient temperature, in other words significantly higher than about 20° C., while having an electric resistivity less than 3.0 $\mu\Omega$.cm at 20° C.

More precisely, said high purity aluminum alloy has a total content of elements other than aluminum of less than 0.1% by weight, and is characterized in that:

the contents of alloy elements, particularly Cu and Fe, are such that the starting alloy recrystallization temperature is at least equal to 150° C., and is preferably equal to at least 200° C.;

the Cu content is preferably equal to at least 5 ppm and not more than 1000 ppm, and is preferably equal to at least 15 ppm and not more than 300 ppm;

the Fe content is preferably equal to at least 2 ppm and not more than 60 ppm, and is preferably equal to at least 3 ppm and not more than 30 ppm;

the contents of elements other than aluminum, particularly of alloying elements and impurities, being such that the electrical resistivity of the alloy measured on a solid completely recrystallized sample, is less than 2.85 $\mu\Omega$.cm at 20° C.

The resistivity in the complete recrystallized state, also called the "annealed" state, is preferably measured after at least 30 minutes of heat treatment at a temperature equal to at least 400° C., this temperature being greater than the highest temperatures reached in known manufacturing processes for flat panel displays.

The recrystallization temperature is defined either by the beginning of recrystallization using the so-called starting recrystallization temperature Tc, or by the end of recrystallization using the so-called finishing recrystallization temperature Tf. In the rest of this text, the starting recrystallization temperature Tc will be defined as the temperature above which a sample that has been cold work-hardened resulting in a reduction of thickness due to rolling equal to 83% (corresponding to generalized deformation $\epsilon$ equal to 2) has more than 10% of its grains recrystallized after being held at this temperature for 15 minutes, and the finishing recrystallization temperature Tf will be defined as the minimum temperature that results in recrystallization of more than 90% of the work-hardened grains after being held at this temperature for 15 minutes.

During his searches, the applicant was surprised to find that the propension of very high purity aluminum alloys to form hillocks at the surface of deposited films was actually related to recrystallization phenomena. The alloy recrystallization temperature that led to the occurrence of hillocks and voids was generally less than about 200° C., and therefore less than or comparable with normal metallization temperatures. However, the mechanism on which this relation is based has not yet been elucidated.

Therefore, the composition and metallurgical state of the alloy according to the invention are such that the starting recrystallization temperature Tc of said alloy is preferably at least equal to 150° C. and even more preferably at least equal to 200° C., in order to significantly reduce the rate of occurrence and the size of hillocks while maintaining the electrical resistivity at very low values very close to those of ultra-pure aluminum, in other words significantly less than 3.0 $\mu\Omega$.cm at 20° C., and preferably less than or equal to 2.85 $\mu\Omega$.cm measured at 20° C. on the solid sample in the completely recrystallized state.

The applicant has also observed that the simultaneous presence of limited quantities (but exceeding a few ppm by weight) of Fe and Cu as alloy elements, can very significantly increase the recrystallization temperature of very pure aluminum (FIGS. 1 and 2). This interaction effect between iron and copper is very surprising, since the effects of each of them individually are very much lower. These behaviors do not satisfy classical recrystallization theory and do not correspond to facts normally accepted in this field, such as the fact that almost all elements in solid solution should substantially increase the recrystallization temperature even at concentrations of less than 100 ppm (in particular see "Aluminum—Properties and physical metallurgy" published by J. E. Hatch, 1984, p. 120).

The contents of alloy elements and alloy impurities according to the invention are also limited by the risks of formation of precipitates that could harm the quality of etchings (particularly when their size exceeds about 15% of the film thickness) or cause difficulties in forming these etchings.

Microscopic examinations by electronic transmission microscopy have also demonstrated that the number of $Al_2Cu$ intermetallic precipitates present in metallization films obtained with the alloy according to the invention, and then heat treated at 400° C., is very low for Cu contents less than or equal to 1000 ppm, and that there are none at all for contents less than or equal to 300 ppm.

The Fe content is also limited such that most of the iron remains in solid solution in aluminum, and the number and size of some precipitates containing iron, such as $Al_3Fe$ and $Al_6Fe$, are limited. Beyond 60 ppm of Fe, there is a strong increase in the susceptibility to corrosion of aluminum alloy interconnections, for example during wet etching operations. This effect starts to be detectable above 30 ppm of Fe.

According to one advantageous variant of the invention, for low contents of Fe and Cu the alloy also contains Si as an alloy element. In particular, when the Cu content is less than 50 ppm and the Fe content is less than 20 ppm, it is advantageous if the Si content is between 2 ppm and 30 ppm. Cu, Fe and Si contents are also such that the starting recrystallization temperature exceeds 150° C., and preferably exceeds 200° C., and the resistivity at 20° C. and in the annealed state is less than or equal to 2.85 $\mu\Omega$.cm.

The applicant has observed that for Fe or Cu contents limited to the previous values, the presence of Si moderately but significantly contributes to increasing the recrystallization temperatures. For example, table 1 shows the influence of a limited content of silicon for copper and iron contents limited to 50 ppm and 20 ppm respectively, the total content of impurities (in other words elements other than Fe, Cu and Si alloying elements) being less than 0.01%. Therefore the complementary effect of silicon, although significant at low iron and copper contents, reduces when iron and copper contents are up to 20 ppm and 50 ppm respectively.

TABLE 1

| Content (ppm by weight) | | | | |
|---|---|---|---|---|
| Fe | Cu | Si | Tc (° C.) | Tf (° C.) |
| 0 | 50 | 0 | 130 | 220 |
| 0 | 50 | 10 | 160 | 260 |
| 5 | 25 | 0 | 180 | 270 |
| 5 | 25 | 10 | 200 | 300 |
| 20 | 50 | 0 | 260 | 325 |
| 20 | 50 | 10 | 260 | 325 |

According to one advantageous variant of the invention, the process for making the alloy includes a refining step that preferably consists of simultaneous addition of Ti and B as refining elements, the titanium content in the alloy then being between 20 ppm and 80 ppm, the boron content being greater than 4 ppm and the B content being such that the Ti/B ratio is between 2.5 and 10 by weight, in order to provide satisfactory refining of the sputtering target grain size and thus make the wear surface of the active part of the target uniform.

According to another variant of the invention, the alloy contains complementary alloy elements such as rare earths in contents exceeding 5 ppm and less than 0.05% which can significantly improve the interface and bond properties between the alloy interconnection circuit according to the invention and other adjacent layers, the resistance of interconnections to corrosion and the dielectric power of the aluminum oxide layer (if any) formed on the interconnections surface.

The total content of impurities, in other words the content of elements other than the alloy and refining elements, is preferably less than 0.01% in order to prevent any risks of the formation of inter-metallic precipitates larger than 10 μm, and for elements that are very soluble in solid aluminum, to reduce the resistivity of the alloy.

Preferably, the total content of alkaline impurities (Li, Na, K, Rb, Cs) in the alloy according to the invention is less than 0.0005%. The content of alkaline impurities is limited by the extremely harmful effects that they may have due to their very high migration speed, particularly along lines of interconnections to interfaces with other materials.

The alloy according to the invention may be obtained by the addition of alloy elements and possibly selected refining elements to a very high purity aluminum matrix, preferably greater than 4N (in other words more than 99.99% of aluminum), and even better greater than 4N7 (in other words more than 99.997% of aluminum).

The active part of the target according to the invention is advantageously obtained by rolling alloy plates according to the invention. Rolling conditions are such that recrystallization takes place during rolling, in other words more precisely while the plate is passing between the rollers or shortly afterwards, in order to obtain high isotropy of the metal, in other words to eliminate the texture which promotes non-uniform wear over the surface of the target. This recrystallization during rolling is preferably obtained by rolling at a temperature exceeding Tf+50° C., where Tf is the finishing recrystallization temperature of the alloy. Rolling is preferably done in a crosswise manner, each rolling step reducing the thickness by at least 20%. Furthermore, it is preferably that the waiting time between each step is sufficient to recrystallize at least 50% of the plate.

Preferably, the active part of the target according to the invention has no internal splits (or flaws) larger than 0.7 mm, and has less than 10 internal splits larger than 200 μm per cubic decimeter of active metal, in other words metal likely to be removed during the cathodic sputtering operation. These limits are sufficient to hold the frequency at which etching faults caused by redeposition of particles and droplets torn off the target during the cathodic sputtering metallization operation, at a completely satisfactory level.

The internal soundness of the active part of the target, in other words the number and size of internal splits, is advantageously evaluated by an ultrasonic check, preferably at a frequency equal to or exceeding 8 MHz, using a process known in French patent application No. 96 01990, made by the applicant.

Also preferably, the grain size of the active metal is less than 2 mm such that the deposited film homogeneity is satisfactory, both in composition and in thickness, in order to give a very uniform wear over the active part of the target.

Another object of the invention is an electrical interconnection circuit characterized in that it comprises at least one aluminum alloy interconnection layer according to the invention, said layer preferably being obtained by cathodic sputtering from a target according to the invention, and consequently having a very much improved resistance to recrystallization than unalloyed aluminum, while maintaining excellent etchability and low resistivity similar to values for pure aluminum.

FIGURES

EXAMPLES

Example 1

Figure 1:
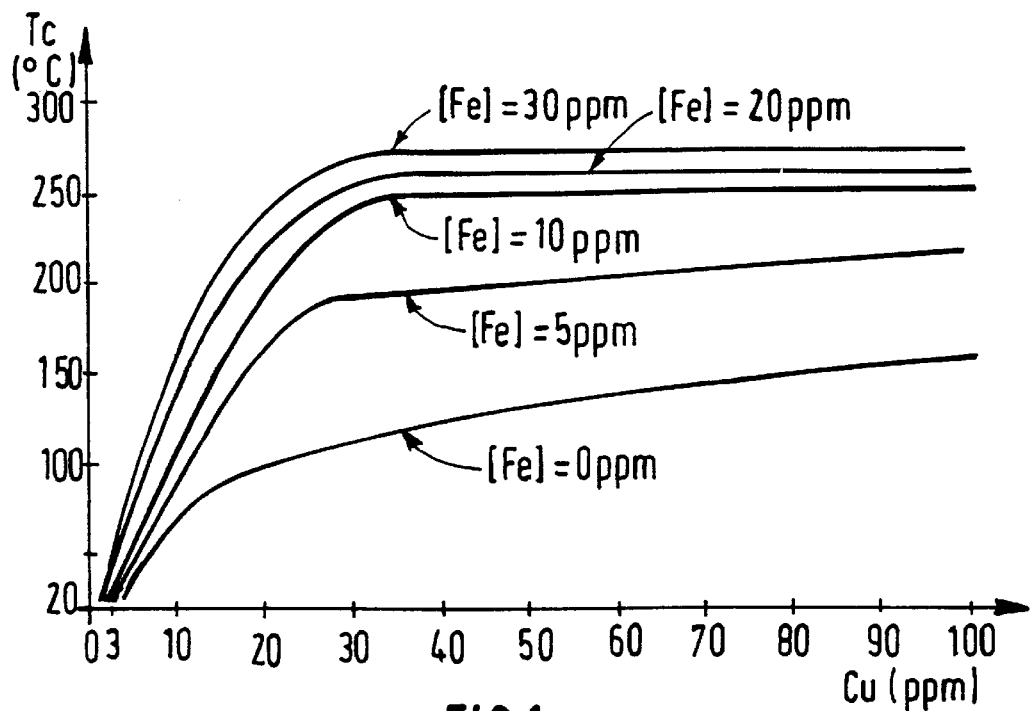
FIG. 1 shows the influence of the Cu and Fe contents of aluminum alloys according to the invention on the starting recrystallization temperature Tc. The total content of elements other than Cu and Fe is less than or equal to 0.01%.

About 4.6 tons of an aluminum alloy were smelted in an electrically heated furnace, starting from refined aluminum with a purity equal to 99.998%, to which small quantities of Fe and Cu were added in order to obtain an Fe content of 8 ppm and a Cu content of 40 ppm. The alloy obtained also contained 9 ppm of Si.

The alloy obtained was then cast in the form of a 3200 mm long rolling slab with a cross-section of 500 mm×1055 mm. During casting, the alloy was treated in line in two successive ladles in order to reduce the contents of dissolved hydrogen and inclusions. The first ladle was a degassing ladle equipped with an argon injection rotor according to the ALPUR® process developed by the applicant. The second ladle was a filtration ladle with a deep bed of tabular alumina gravel, also made according to a process developed by the applicant and known under the name of PECHINEY DBF (Deep Bed Filter).

The slab was then sawn in order to eliminate disturbed areas at the bottom and top of the plate, and its length was adjusted to 2400 mm.

Slices were then taken perpendicular to the direction of casting at the top and bottom of the slab in order to check the macrographic structure and the gas content of the solidified metal. These examinations revealed a very coarse macrographic structure (in other words grain sizes measured in centimeters and elongated perpendicular to the solidification front), minor shrinkage porosity in the central part the product and a hydrogen content of less than 0.07 ppm.

The large surfaces of this slab sawn in this manner were then scalped by milling about 8 mm per surface, in order to remove the casting skin and the cortical area with fine basaltic grains. The slab thus scalped was then homogenized for 32 hours at 580° C. in an electric furnace with a dry atmosphere in order to microscopically homogenize the composition while avoiding regassing it. This slab was then cooled in the furnace, put into ambient air at down to 500° C., and then placed on the feed table of a reversible roller and rolled parallel to the casting axis in several steps until its thickness was reduced to 75 mm. The temperature of the strip at the end of this first rolling step was about 460° C.

The length of the strip output from this rolling operation was about 15.50 m, and it was then cut by shearing into 1 m long pieces, after cutting off a 25 cm strip at the both ends of the strip.

After a 90° rotation about an axis perpendicular to the large surfaces of each piece, each of these pieces was then immediately hot rolled again in several steps, along a direction perpendicular to the previous rolling direction ("cross" rolling) to reduce its thickness to 12.5 mm. At the end of this second rolling step, the temperature of the strip was between 370° C. and 410° C., depending on the order of entry into rolling.

This thus gave fifteen 12.5 mm thick strips, 1000 mm wide and 6.3 m long, that were cut again by shearing to obtain ninety 12.5 mm thick plates, 1000 mm wide and 900 mm long, suitable for machining into cathodic sputtering targets.

Figure 2:
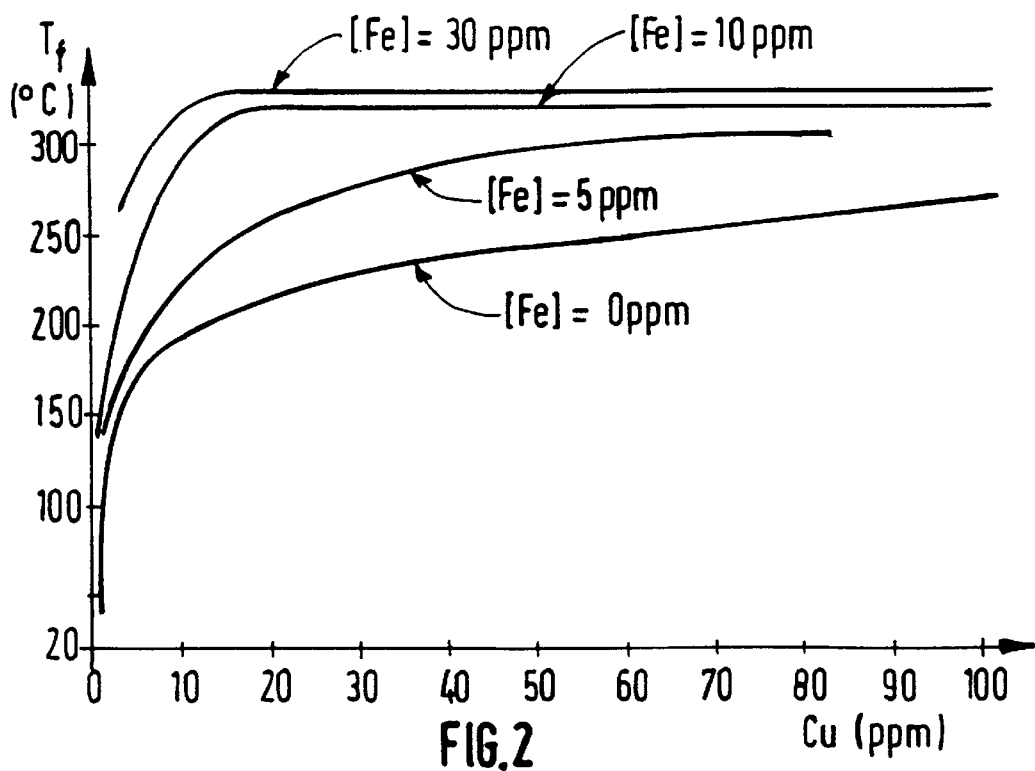
FIG. 2 shows the influence of the Cu and Fe contents of aluminum alloys according to the invention, on the finishing recrystallization temperature Tf. The total content of elements other than Cu and Fe is less than or equal to 0.01%.

Recrystallization temperatures were measured on the initial refined aluminum and on the alloy obtained after the addition of Cu and Fe. These measurements showed that the starting and finishing recrystallization temperatures of the initial refined alloy were lower than 25° C., and also that the alloy obtained had starting and finishing recrystallization temperatures of 250° C. and 320° C. respectively. This is consistent with FIGS. 1 and 2, which indicate that the desired increases in recrystallization temperatures can be achieved in the presence of Cu with Fe contents of less than 10 ppm. As indicated above, such low levels of Fe contents have the advantage of minimizing the susceptibility to corrosion of the alloy.

A micrographic inspection was also carried out on plate samples, which revealed that the plates obtained had a homogeneous and fine grain size less than 2 mm parallel to the large surfaces, and flattened parallel to them, less than 0.7 mm thick. For comparison, strips rolled parallel to the casting axis only had an elongated grain in the rolling direction reaching up to 3 mm, and also a residual rolling texture, in other words a preferred orientation in the direction of rolling.

Further micrographic examinations revealed that there were no intermetallic precipitates.

The metal resistivity measured on recrystallized samples taken from the plates at 20° C. did not exceed 2.70 $\mu\Omega$.cm.

After these rolling and cutting operations, and then cooling, each plate was inspected by immersed ultrasonic inspection at a frequency of 10 MHz, and the recorded ultrasonic echoes were compared with the echo from a 300 $\mu$m diameter flat bottom. These measurements were used to classify the plates into three categories, depending on the number of equivalent size echoes larger than 200 $\mu$m per cubic decimeter of inspected metal; plates with more than 10 echoes (8 plates), plates with 2 to 10 echoes (27 plates) and plates with fewer than 2 echoes (55 plates).

After these inspections, one plate in each of the three categories was sampled, machined on the surface using a diamond tool in order to reduce its thickness to 10 mm, and then machined on its sides in order to obtain final plates with dimensions of 790 mm×880 mm×10 mm. These final plates were then connected to electrical and cooling connection supports using the known technique for making cathodic sputtering targets.

These three targets were used for metallization of glass substrates with dimensions 550×650 mm suitable for the production of flat displays using the technique normally used for making interconnections based on very high purity aluminum (5N). The substrate temperature during the deposit was 200° C., in other words less than Tc, and passivation was done at 320° C., in other words at a temperature of close to Tc.

Manufacturing inspections, including optical microscopy inspections, also showed that the frequency of occurrence of hillocks for the three tested targets was less than half the frequency observed for displays metallized with very high purity aluminum targets containing less than 2 ppm of Fe and of Cu, and that particularly the height of these hillocks was very much reduced, the maximum height changing from 0.5 $\mu$m to 0.2 $\mu$m. Furthermore, the grain size of aluminum alloy films according to the invention was significantly lower, by a factor of about 3, than was observed with undoped 5N aluminum.

Hillocks with a height of less than 0.2 $\mu$m are considered as being quite acceptable for subsequent display manufacturing operations, whereas hillocks with a height of more than 0.3 $\mu$m, or even 0.4 $\mu$m, often make them unusable since they exceed the thickness of the films deposited or formed subsequently on the surface of aluminum alloy or pure aluminum interconnections.

However, displays made from a target in the first category (in other words containing more than 10 defects larger than 200 $\mu$m per cubic decimeter of active metal) have significantly more etching defects than were found in displays made from the other two targets, which made it necessary to scrap more than 10% of manufactured displays. These etching defects were related to the redeposition of liquid droplets torn off the target by the occurrence of micro-arcs during the metallization operation, onto the aluminum film.

Example 2

Tests were also carried out under the same conditions as in example 1, except for the procedure for smelting the aluminum alloy at the time of casting.

At the time of casting, B and Ti were continuously added to the liquid metal using high purity aluminum alloy wire containing 5% Ti and 1% by weight. The rate at which wire was added was adjusted to give a Ti content of the order of 50 ppm and a B content of the order of 10 ppm in the cast alloy, in other words 1 kg of alloy wire was added per ton of cast metal.

Macrographic segments sampled while sawing the ends of the "as cast" slab then revealed a much finer granular structure of the metal than in the previous example, and a large reduction of shrinkage porosities in the central part of the slab.

After rolling, under conditions identical to those in example 1, the grain of the plates was much finer and its dimensions did not exceed 1 mm in all directions. The measured resistivity on plate samples did not exceed 2.80 $\mu\Omega$ at 20° C. Furthermore, during ultrasonic inspections, only 2 out of the 90 manufactured plates had more than 10 echoes with an equivalent size exceeding 200 $\mu$m per cubic decimeter of metal.

Targets made from this alloy using exactly the same procedure as in example 1, and tested under exactly the same conditions, gave slightly better results concerning the occurrence frequency and size of hillocks, and at the same time it was observed that the film grain size after the passivation treatment at 400° C., was also smaller.

These tests demonstrated that refining by simultaneous and limited additions of B and Ti significantly increased the proportion of plates in which the number and size of internal splits was satisfactory, while maintaining and even slightly improving the characteristics aimed at in this invention.

ADVANTAGES

Therefore, tests carried out by the applicant demonstrated that, unexpectedly and contrary to previous knowledge, it is possible to design grades of aluminum alloys with low contents of some elements which can significantly reduce the occurrence of hillocks and voids on the surface of films obtained by cathodic sputtering from these alloys, while presenting use characteristics similar to those for very high purity aluminum, and particularly low electrical resistivity and very good etchability.

The simultaneous presence of limited quantities of Fe and Cu, although exceeding a few ppm by weight each, can significantly reduce the rate of occurrence and the size of hillocks related to the large increase in the recrystallization temperature above what is obtained with very pure aluminum, while maintaining the electrical resistivity at very low values very close to that obtained with ultra pure aluminum, in other words significantly less than 3.0 $\mu\Omega$ at 20° C.

The target according to the invention can be used in known metallization by cathodic sputtering processes, without modifying the technique and enabling etching under the same conditions as are used for very high purity aluminums.

Apart from their high resistance to the formation of hillocks, interconnection circuits according to the invention have an electrical resistance comparable with resistances obtained with very pure unalloyed aluminum, they have very fine grains, and the durability of this fineness at high temperatures is better than with ultra pure aluminum (more than 5N) due to the high value of the recrystallization temperature.

What is claimed is:

1. A cathodic sputtering target having an active part comprising the volume of said target that may be removed during cathodic sputtering operations, and is composed of a high purity aluminum alloy, in which a total content of alloy elements other than aluminum is less than 0.1% by weight and for which:

contents of alloy elements are such that a starting recrystallization temperature of said aluminum alloy is at least equal to 150° C.;

a Cu content is not less than 5 ppm and not more than 300 ppm;

a Fe content that is not less than 2 ppm and not more than 8 ppm;

the active part is recrystallized at or above said starting recrystallization temperature to form grains smaller than 2 mm; and contents of alloy elements other than aluminum are such that the electrical resistivity of said aluminum alloy measured on a sample of said recrystallized active part is less than 2.85 $\mu\Omega$ cm at 20° C.

2. A target according to claim 1, characterized in that the contents of alloy elements are such that the starting recrystallization temperature of said aluminum alloy is equal to at least 200° C.

3. A target according to claim 1, characterized in that the Cu content of said aluminum alloy is at least 15 ppm, and that the Fe content of said aluminum alloy is at least 3 ppm.

4. A target according to claim 1, characterized in that the Cu content of said aluminum alloy is less than 50 ppm, and a Si content of said aluminum alloy is between 2 ppm and 30 ppm.

5. A target according to claim 1, characterized in that said aluminum alloy also comprises a Ti content of between 20 ppm and 80 ppm and a B content exceeding 4 ppm, and the titanium to boron (Ti/B) ratio by weight is between 2.5 and 10.

6. A target according to claim 1, characterized in that a total content of impurities comprising alloy elements other than Cu, Fe, Si, Ti and B in said aluminum alloy is less than 0.01%.

7. A target according to claim 1, characterized in that a total content of alkali metals Li, Na, K, Rb, and Cs in said aluminum alloy is less than 0.0005%.

8. A target according to claim 1, characterized in that the active part of said target has no internal splits larger than 0.7 mm, and has less than 10 internal splits larger than 200 $\mu$m per cubic decimeter of active metal that could be removed during the cathodic sputtering operation.

9. A target according to claim 4, wherein said aluminum alloy also comprises a Ti content of between 20 ppm and 80 ppm and a B content exceeding 4 ppm, and the titanium to boron (Ti/B) ratio by weight is between 2.5 and 10.

* * * * *